Figure 1:
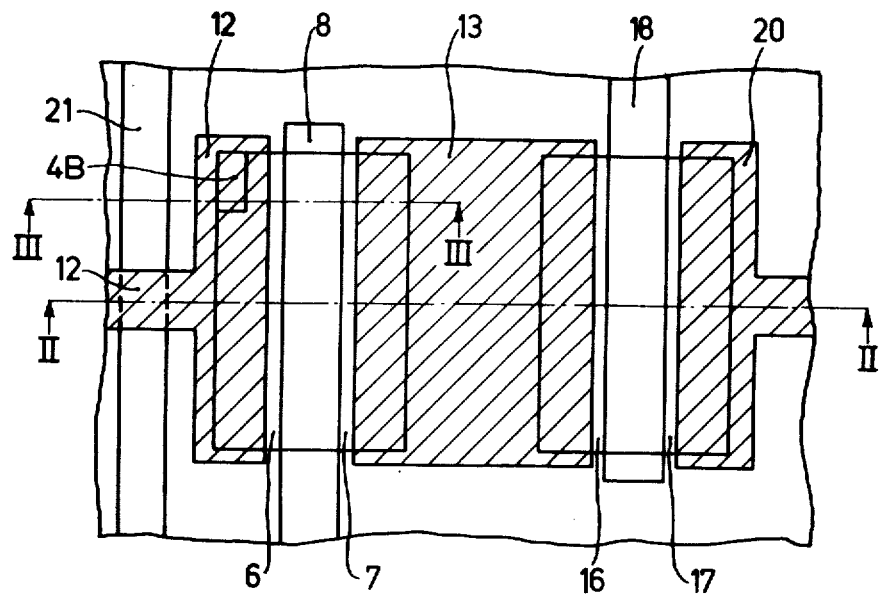

United States Patent [19]

Shappir

[11] 4,016,594
[45] Apr. 5, 1977

[54] SEMICONDUCTOR DEVICE AND METHOD OF MANUFACTURING THE DEVICE

[75] Inventor: Joseph Shappir, Technion City, Ill.

[73] Assignee: U.S. Philips Corporation, New York, N.Y.

[22] Filed: Apr. 8, 1974

[21] Appl. No.: 458,527

Related U.S. Application Data

[63] Continuation of Ser. No. 245,243, April 18, 1972, abandoned.

[30] Foreign Application Priority Data

June 8, 1971 Netherlands .................... 7107805

[52] U.S. Cl. .................. 357/41; 357/23; 357/42; 357/49; 357/50; 357/59
[51] Int. Cl.² ............... H01L 27/02; H01L 27/12
[58] Field of Search ....... 317/235 G, 235 B, 235 F, 317/235 AE, 235 AN, 235 AG, 235 AH; 357/23, 41, 42, 43, 49, 50, 59

[56] References Cited
UNITED STATES PATENTS

| | | | |
|---|---|---|---|
| 3,327,182 | 6/1967 | Kisinko | 317/235 |
| 3,391,023 | 7/1968 | Frescura | 117/212 |
| 3,405,329 | 10/1968 | Loro et al. | 317/234 |
| 3,590,342 | 6/1971 | Jekat | 317/235 |
| 3,609,479 | 9/1971 | Lin et al. | 317/235 |
| 3,648,125 | 3/1972 | Peltzer | 317/235 |
| 3,673,471 | 6/1972 | Klein et al. | 317/235 R |
| 3,786,318 | 1/1974 | Momoi et al. | 317/235 |

OTHER PUBLICATIONS

*Electronics*, Mar. 1, 1971, pp. 52–55, article by Peltzer et al.
Appels et al., *Philips Res. Repts.* 25, pp. 118–1320, Apr., 1970.

*Primary Examiner*—Martin H. Edlow
*Attorney, Agent, or Firm*—Frank R. Trifari; Jack Oisher

[57] ABSTRACT

A semiconductor device having at least an insulated gate field effect transistor. According to the invention, the device comprises a first semiconductor region of a first conductivity type, an inset insulating pattern in a surface of said semiconductor region, a second region of the second conductivity type surrounded by said pattern, and source and drain zones of the first conductivity type which adjoin the insulating pattern. Said field effect transistor is preferably combined with a complementary field effect transistor provided beside it in the first region. The invention also comprises a very advantageous method of manufacturing said structure in which the insulating pattern and the gate electrodes serve as masks.

9 Claims, 18 Drawing Figures

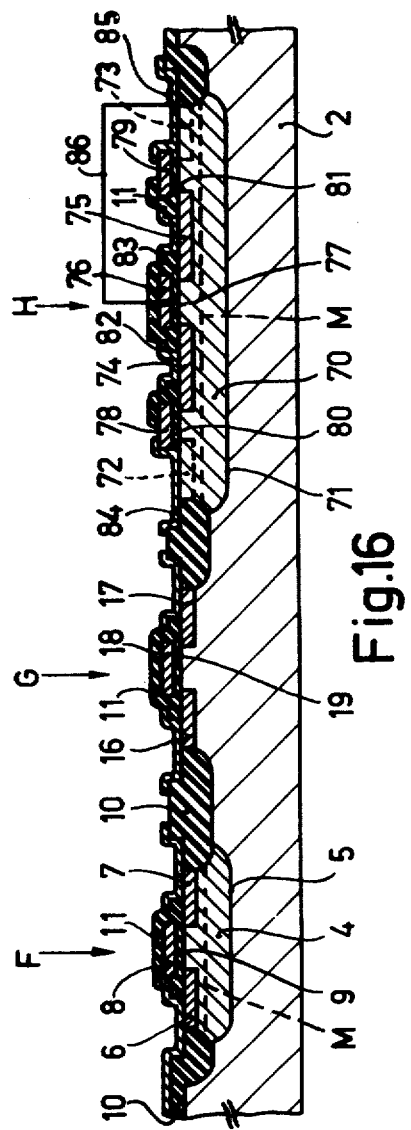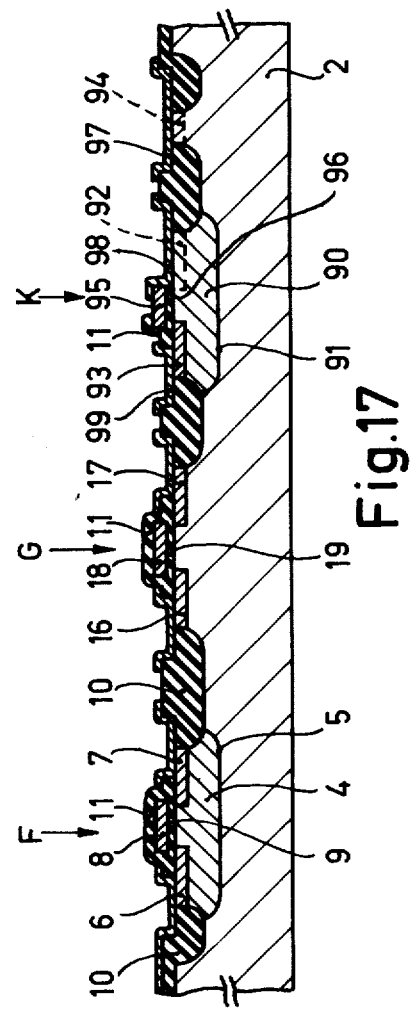

SEMICONDUCTOR DEVICE AND METHOD OF MANUFACTURING THE DEVICE

This is a continuation of application Ser. No. 245,243, filed Apr. 18, 1972 now abandoned.

The invention relates to a semiconductor device having a semiconductor body comprising at least an insulated gate field effect transistor, which body comprises a first region of a first conductivity type and a second region of the second conductivity type adjoining the surface and forming a p-n junction with the first region, source and drain zones of the first conductivity type adjoining the surface being provided in the second region, at least a gate electrode layer being provided between the source and drain zones and being separated from the semiconductor body by an insulating layer.

The invention furthermore relates to a method of manufacturing the device.

Semiconductor devices of the type described are known and are used in various embodiments, in particular in monolithic integrated circuits. Such a structure, in which the source and drain zones of the said field effect transistor are present in a region which is separated from the remaining part of the semiconductor body by a p-n junction, is of particular importance in that it provides the possibility of realizing combinations of semiconductor circuit elements in integrated circuits which are interesting from a point of view of circuitry and technology.

For example, one or more bipolar transistors can be provided in a very simple manner in the same semiconductor body beside the said field effect transistor, which involves no or very few extra processing steps. Of even greater importance is the possibility of providing, in the same semiconductor body beside the said field effect transistor, one or more field effect transistors of a complementary structure. Such combinations of p-channel and n-channel field effect transistors are used in many important integrated circuits, in particular in memory circuits.

The semiconductor devices described are preferably used in very fast circuits and it is consequently of importance that the dimensions and hence also the various capacities of the resulting structure are maintained as small as possible as a result of which the packing density (number of circuit elements per surface unit) can also be increased. In known semiconductor devices this is often the case to an insufficient extent, which is caused for a considerable part by the masking and alignment steps necessary for the manufacture, and the tolerances to be observed.

One of the objects of the present invention is to provide a semiconductor device of a new structure having a field effect transistor of very small dimensions with which a very high packing density can be obtained, which device may be used for obtaining very fast integrated circuits, while moreover said device can be manufactured by means of a comparatively small number of alignment and masking steps, with for the greater part a very wide tolerance.

The invention is inter alia based on the recognition of the fact that in particular the area required for contacting the source and drain zones of the field effect transistors present, can be considerably reduced by using a pattern of an insulating material which is at least partly inset in the semiconductor body, preferably of oxide provided by local oxidation, which surrounds an island-shaped region of the second conductivity type provided in the first region of the first conductivity type, said pattern also bounding at least the source and drain regions of an insulated gate field effect transistor provided in said island.

Therefore, a semiconductor device of the type mentioned in the preamble is characterized according to the invention in that the device comprises a pattern of an electrically insulating material which is at least partly inset in the semiconductor body and which surrounds the second region substantially entirely, the p-n junction between the first and the second region adjoining the inset pattern, the source and drain zones also adjoining the inset pattern.

In the device according to the invention, the second region of the second conductivity type is already separated from the first region by a p-n junction, so that further isolation by means of an inset insulating pattern seems superfluous in this case. It has been found, however, that the use of the said inset pattern does surprisingly make sense in this case and enables the realization in a very simple manner of a structure having considerable advantages, in which notably the relative positions of substantially all the zones is fixed by the inset pattern as will be described in detail hereinafter.

One of the important advantages of the semiconductor device according to the invention is that it can be manufactured in a very simple manner and presents the possibility of using source and drain ones of minimum dimensions, while the distance between the said field effect transistor and the nearest circuit element in an integrated monolithic circuit can also be minimized. As a result of this, a great packing density and a reduction of 30 to 50% of the overall surface area of the circuit can be achieved. The capacity between the metallization and the underlying semiconductor body can also be considerably reduced by causing the metal tracks to extend at least partly over the inset insulating pattern. All these advantages are of great significance to obtain very fast circuits.

According to a very important preferred embodiment the inset pattern of insulating material moreover surrounds a further part of the first region adjoining the surface, in which part are provided surface-adjoining source and drain zones of the second conductivity type, of a field effect transistor complementary to the said field effect transistor, which source and drain zones adjoin the inset pattern, at least a gate electrode layer separated from the semiconductor body by an insulating layer being provided between said source and drain zones. Such a combination of one or more, for example, n-p-n field effect transistors with one or more field effect transistors of a complementary structure (p-n-p) is of particular interest in many circuits as was already described above. In order to increase the packing density, the inset insulating material which surrounds the second region will preferably belong partly also to the inset insulating material which surrounds the further part of the first region.

A further important preferred embodiment for combining a field effect transistor with bipolar circuit elements is characterized in that the inset insulating pattern surrounds a third region of the second conductivity type which adjoins the surface, adjoins the inset insulatng material and forms a p-n junction with the first region, in which third region is present at least a further zone of the first conductivity type adjoining the surface which, together with the third region, forms part of a bipolar circuit element. In order to obtain a vertical bipolar transistor, a further preferred embodiment is characterized in that the said further zone of the first conductivity type adjoins the inset pattern, and the third region forms the base zone of a vertical bipolar transistor of which the further zone and the first region form the emitter and collector zones.

A combination with an isolated lateral bipolar transistor is obtained when two zones of the first conductivity type which adjoin the surface are provided in the third region, said zones constituting the emitter and collector zones of a bipolar lateral transistor of which the third region is the base zone.

An important improvement of the above preferred embodiments is obtained when auxiliary gate electrodes are provided above the third region, which electrodes are separated from the semiconductor surface by an insulating layer and are preferably DC-connected to the base zone of the bipolar transistor so as to prevent the formation of stray current channels.

These preferred embodiments are advantageously manufactured in such manner that the second and third regions of the second conductivity type are simultaneously provided, that the source and drain zones of the first field effect transistor and the further zone of the first conductivity type are simultaneously provided, and that the possibly present gate electrodes, as well as the associated insulating layers, are simultaneously provided.

The inventive furthermore relates to a particularly simple and efficacious method of manufacturing such a semiconductor device. Said method in which a second region of the second conductivity type which forms a p-n junction with the first region and adjoins a surface of the body is provided in a first region of a first conductivity type which likewise adjoins said surface, the source and drain zones of a field effect transistor being provided in the second region is characterized according to the invention in that a layer masking against oxidation is provided on a part of the surface of the first region, that a layer-shaped oxide pattern which is at least partly inset in the semiconductor body and which surrounds a surface part of the first region at least substantially entirely is then provided by oxidation of the surface parts not covered by said masking layer, that a doping material determining the second conductivity type is provided from outside in said surface part to form the second region, the inset oxide pattern masking against said doping, that a doping material determining the first conductivity type is provided in the second region from outside via surface parts of the second region to form at least the source and drain zones, the inset oxide pattern being used as a mask against the said doping material, and that at least a gate electrode layer is provided which is separated from the second region by an electrically insulating layer and which extends above a part of the surface of the second region between the drain zones.

A very simple manner of manufacturing is obtained when prior to providing the source and drain zones, at least a gate electrode layer is provided after which the doping material determining the first conductivity type is provided in the second region, the gate electrode layer or layers being also used as a mask against said doping material.

The method according to the invention has very important advantages as compared to known methods of manufacturing the semiconductor device with an insulated gate field effect transistor provided in an isolated island.

First of all, the introduction of the doping material (and possibly the partial outdiffusion thereof via the surface) necessary to form the second region, as well as the provision of the activators serving for the formation of the source and drain zones may all be carried out by using the masking effect of the inset oxide pattern and preferably also of the gate electrode(s), which parts of the structure have usually to be present already owing to other functions (insulation, control). As a result of this, a few of the alignment steps necessary in known methods, and the tolerances to be observed, may be omitted as a result of which not only the definition of the dimensions of the various zones is obtained in a very simple manner, but also very small dimensions for the source and drain zones can be realized. The contactng of such small zones need not present any problems, since the source and drain electrodes or contacts are present on the relevant zones only for a small part of their surface, the other parts of the source and drain electrodes being present on the comparatively thick inset oxide. As a result of this the capacities of the p-n junctions between the source and drain zones and the second region may be kept very small, while the alignment of the contact mask may also take place relative to the gate electrode pattern instead of relative to the source and drain zones as in the known method. One of the results is a considerably smaller distance between contact and gate electrode.

As a result of this, the overall length of the field effect transistor may be reduced incidentally by more than 30%, which also results in smaller diffusion capacities.

It will be obvious that the said field effect transistors can each comprise more than one gate electrode layer and that, for example in the case of a tetrode field effect transistor, a surface zone of the first conductivity type present between the two gate electrodes, the "island" serving for the connection of the two current channel parts, can be formed simultaneously with the source and drain zones, only the inset pattern and the gate electrode layers serving as maskings.

In most cases it will be preferred that the resulting field effect transistor has a comparatively low threshold voltage, for example, with an absolute value of less than 2 volt. In order to obtain the small surface doping of the channel region between the source and drain electrode zones, which is necessary for this purpose, it is often necessary to diffuse the doping material introduced to form the second region, for example by diffusion or ion implantation, partly out of the semiconductor body via the surface. In the method according to the invention this may be carried out in a very simple manner in that, according to a preferred embodiment, after providing the doping material determing the second conductivity type and preferably prior to providing the gate electrode layer, said doping material is partly diffused out of the semiconductor body throughout the surface part occupied by the second region and bounded by the inset oxide pattern in a space having an atmosphere of reduced pressure, as a result of which the doping concentration in a zone of the second region adjoining the surface obtains a profile increasing to a maximum value from the surface to the interior. In this out-diffusion, the inset oxide pattern already present is used as a diffusion window. In this case, the source and drain zones may extend in a direction transverse to the surface on either side of the level having the said maximum value of the doping concentration. Preferably, however, the source and drain zones are provided entirely within the said zone of the second region with a doping concentration increasing from the surface, inter alia so as to maintain the breakdown voltage between the source and drain zones and the second region comparatively high, which is desirable for most applications.

Of particular importance is a preferred embodiment of the method according to the invention in which beside the said field effect transistor provided in the second region, a field effect transistor having a structure which is complementary thereto is provided in the first region. According to the invention, such a preferred embodiment is characterized in that an inset oxide pattern is provided which moreover surrounds at least a further part of the first region and that, after the formation of the second region, a doping material determining the second conductivity type is provided from outside in the further part of the first region to form at least the source and drain zones of a second field effect transistor complementary to the first field effect transistor, the inset oxide pattern being used as a mask, and that at least a gate electrode layer is provided on the further part between the source and drain zones, said layer being separated from the semiconductor body by an electrically insulating layer.

The source and drain zones of the second complementary field effect transistor may be provided both prior to or after the source and drain zones of the first field effect transistor present in the second region. The layer masking against oxidation may form part of the insulating layer on which the gate electrode is provided in one or more field effect transistors.

This method will preferably be carried out so that prior to providing the source and drain zones of the complementary second field effect transistor, at least a gate electrode layer is provided on the further part, after which the doping material determining the second conductivity type is provided in the further part, said gate electrode layer or layers being also used as a mask or masks against said doping material.

Besides the doping of the channel region and the thickness and the material of the insulating layer on which the gate electrode is provided, the threshold voltage of an insulated gate field effect transistor is also determined to a considerable extent by the work function of the material of the gate electrode layer. Since said gate electrode layer is preferably used as a mask during providing the source and drain zones, the method according to the invention is exceptionally suitable to influence the threshold voltage, as is desired, simultaneously with the provision of the source and drain zones by using polycrystalline silicon as a gate electrode layer and doping this. This doping of the polycrystalline material may often take place advantageously during the use of the polycrystalline gate electrode layer as a mask, as a result of which the threshold voltage is varied. According to the invention, a preferred embodiment is therefore characterized in that, in order to form the gate electrode layer or layers and possible interconnections, a layer of polycrystalline silicon is provided, from which layer the gate electrode layer or layers and a possible interconnection pattern are formed by an etching treatment and that in order to reduce the resistance of the polycrystalline silicon and to give the threshold voltage of at least one of the field effect transistors a desirable value, the polycrystalline silicon of at least one of the gate electrode layers is doped with a donor or acceptor material. The polycrystalline silicon is preferably doped with phosphorus.

At least one gate electrode layer is preferably doped simultaneously with the source and drain zones of a field effect transistor. It will be advantageous in many cases to dope a gate electrode layer of a field effect transistor simultaneously with the source and drain zones of the same field effect transistor.

Figure 2:
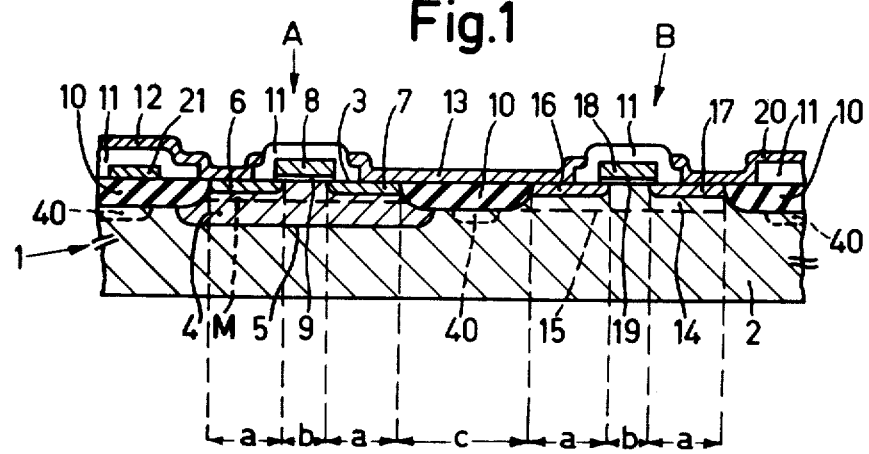
Figure 3:
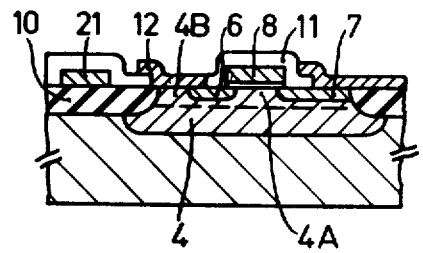
Figure 4:
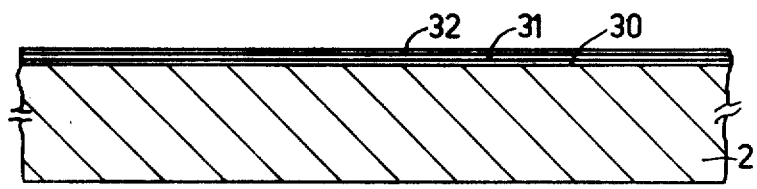
Figure 15:
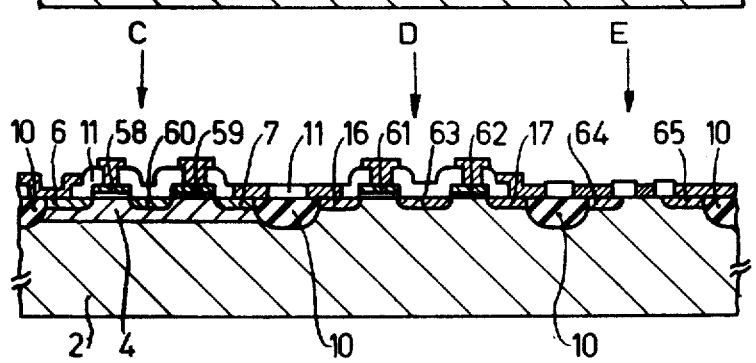
Figure 18:
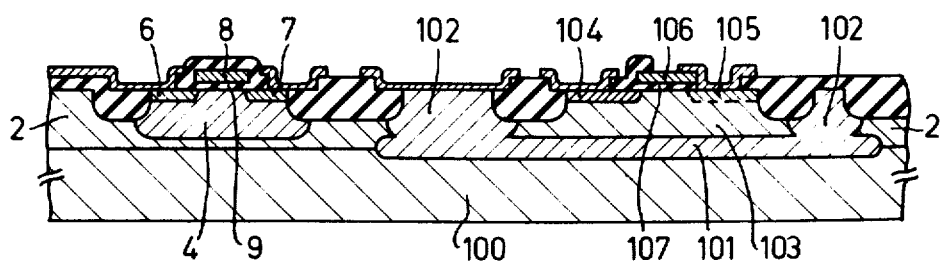

The invention will now be described in greater detail with reference to a few embodiments and the drawing, in which FIG. 1 is a diagrammatic plan view of a part of a device according to the invention, FIG. 2 is a diagrammatic cross-sectional view of the device shown in FIG. 1 taken on the line II—II, FIG. 3 is a diagrammatic cross-sectional view of a detail FIG. 1 taken on the line III—III, FIGS. 4 to 14 are diagrammatic cross-sectional views of the device shown in FIGS. 1 and 2 in successive stages of manufacture taken on the line II—II of FIG. 1, and FIG. 15 is a diagrammatic cross-sectional view of another device according to the invention, FIG. 16 is a diagrammatic cross-sectional view of a further device according to the invention and FIGS. 17 and 18 are diagrammatic cross-sectional views of still other devices according to the invention.

The figures are diagrammatic and not drawn to scale. Corresponding parts are denoted by the same reference numerals in the figures. Metal layers are shaded in FIG. 1. In the cross-sectional views, semiconductor zones shaded in the same direction are of the same conductivity type.

FIG. 1 is a plan view, FIG. 2 is a diagrammatic cross-sectional view taken on the line II—II, and FIG. 3 is a diagrammatic cross-sectional view taken on the line III—III of a semiconductor device according to the invention. The device comprises a semiconductor body 1 of silicon in which an insulated gate field effect transistor A is provided. The body comprises a first region 2 of n-type silicon which adjoins a surface 3 of the body, and a second region 4 of p-type silicon which forms a p-n junction 5 with the first region 2. N-type conducting source and drain zones 6 and 7 adjoining the surface 3 are provided in the second region 4, between which source and drain zones a gate electrode 8 of polycrystalline silicon is provided which is separated from the underlying second region 4 by an insulating layer 9 of silicon oxide.

According to the invention, the device comprises a pattern 10 of electrically insulating material, in the present case silicon oxide, which is inset at least partly in the semiconductor body, said inset pattern 10 surrounding the second region 4 substantially entirely. The p-n junction 5 between the first region 2 and the second region 4 adjoins the inset oxide pattern 10, the source and drain zones 6 and 7 also adjoining the inset pattern 10.

An insulating layer 11 of silicon oxide is further provided on the surface 3 and on the gate electrode 8, in which layer contact windows are etched through which the source and drain zones 6 and 7 are contacted by means of aluminum layers 12 and 13 which partly extend over the inset oxide 10. At the area of the part 4B of the region 4, the source zone 6 is short-circuited with said region 4 by the layer 12, see FIG. 3.

As a result of the structure used, the source and drain zones 6 and 7 can have minimum dimensions (width in this example 10 microns), while also the capacity between the aluminum layers 12, 13 and the underlying semiconductor material is very small in that said aluminum layers extend for a considerable part above the thick inset oxide 10. This is related inter alia with the very simple method according to which the device according to the invention can be manufactured and which will be described in detail hereinafter. Furthermore, by using the inset insulating pattern, the distance of the field effect transistor A described here to an adjacent semiconductor circuit element can be made very small which enables a great packing density, with a reduction of 30 to 50% of the overall area as compared to that of known structures.

In the embodiment described here, this is illustrated in detail in that (see FIGS. 1 and 2) the inset oxide pattern 10 moreover surrounds a further part 14 of the first region which adjoins the surface 3 and which in FIG. 2 is present between the broken lines 15 and the surface 3. In this further part 14 are provided p-type source and drain zones 16 and 17 of a p-channel field effect transistor B complementary to the n-channel field effect transistor A and adjoining the surface 3. The source and drain zones 16 and 17 also adjoin the inset oxide pattern 10, as well as the zones 6 and 7, and a gate electrode layer 18 of polycrystalline silicon which is separated from the further part 14 of the silicon region 2 by an oxide layer 19 is present between the zones 16 and 17.

The complementary field effect transistors A and B are separated from each other by a part of the oxide pattern 10 which belongs to both to the pattern which surrounds the second region 4 and to the pattern part which surrounds the said further part 14 of the first region 2. This common part of the inset pattern 10 may be chosen to be very narrow, the example 10 microns, as a result of which the distance between the gate electrodes 8 and 18 of the transistors A and B can have a very small value, for example 30 microns. This in contrast with known methods in which, for example, the distance between the gate electrodes 8 and 18 is always at least 50 microns as a result of the distances and alignment tolerances to be observed in masking.

The source and drain zones 16 and 17 of the p-channel field effect transistor B adjoin the aluminum layer 13 (which also contacts the zone 7) and the aluminum layer 20 via windows in the oxide layer 11.

In this embodiment the transistors A and B form part of a monolithic integrated circuit. In addition to the gate electrode layers 8 and 18, a polycrystalline silicon layer 21 is present which serves as an interconnection between other parts of the integrated circuit, which parts are not shown. This interconnection 21 crosses the aluminum layer 12 and is covered by the oxide layer 11 at least at the area of the cross-over. In the places which are not shown in the drawing, the layers 8, 18 and 21 are contacted via contact windows in the oxide layer 11.

According to the invention, the device described is manufactured as follows. The various processing steps are described only in so far as they are used on the surface where the field effect transistors are provided; in so far as, for example, diffusions penetrate into the other surface of the plate (and are possibly removed therefrom by grinding or etching) this is not shown in the figures since this has no relation with the invention.

Starting material (see FIG. 4) is an n-type substrate 2 of silicon with preferably a (111) or (100) orientation and, for example, a resistivity of 6 ohm-cm. A 0.1 micron thick layer of silicon oxide is provided on said substrate by thermal oxidation. Then, while using known methods, a layer of silicon nitride 31, 0.1 micron thick, is provided and said layer 31 is again covered with a 0.1 micron thick layer of pyrolytic silicon oxide. For the provision of silicon nitride layers and the methods used for etching said layers, reference is made to Appels et al, "Phillips Research Reports", April, 1970. pp 118–132, in which paper all the information necessary in this respect to those skilled in the art is given.

Figure 5:
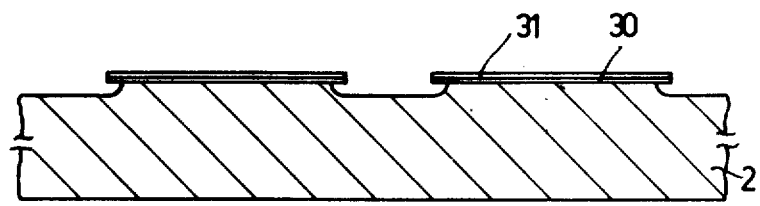

A mask masking against oxidation is then formed by masking and etching from the layers 31 and 30 at the area of the field effect transistors A and B to be provided. For that purpose, the oxide layer 32 is first given the shape of the anti-oxidation mask by a usual photolithographic method. The remaining parts of the oxide layer 32 are then used as masks to give the underlying nitride layer the desirable shape by etching in phosphoric acid, after which the remaining parts of the layer 32 as well as the parts of the layer 30 not present below the nitride are removed by etching in a buffer solution with hydrofluoric acid. In this manner (see FIG. 5) an anti-oxidation mask 30, 31 remains, after which the parts of the silicon surface not covered by the layers 30 and 31 are etched away over a depth of 1 micron. The structure shown in FIG. 5 is obtained. If desirable, the etching step may be omitted, in which case the inset oxide pattern to be formed subsequently, will partly project above the silicon surface.

Figure 6:
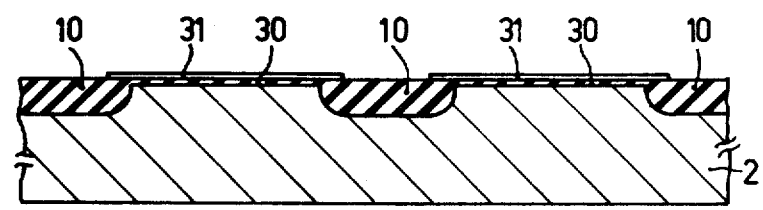

The etched surface parts of the silicon not covered by the mask 30, 31 are then oxidized by thermal oxidation at 1000° C for 16 hours in moist oxygen, an oxide pattern 10 inset in the body being formed whose surface substantially coincides with the original surface of the semiconductor body, see FIG. 6, and which at the area of the field effect transistors A and B to be provided surrounds surface parts of the region 2.

Figure 7:
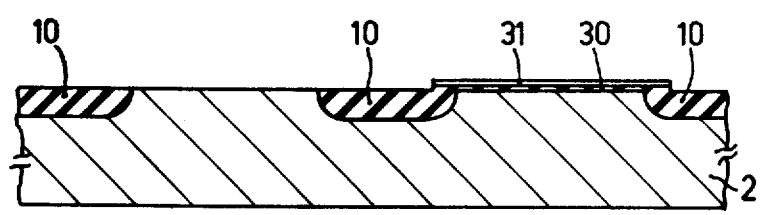

A layer of silicon oxide of 0.1 micron is then provided again pyrolytically over the assembly, after which by using photolithographic methods as described above, the layers 30 and 31 are entirely removed above the region where the n-channel field effect transistor A is to be provided, see FIG. 7.

Figure 8:
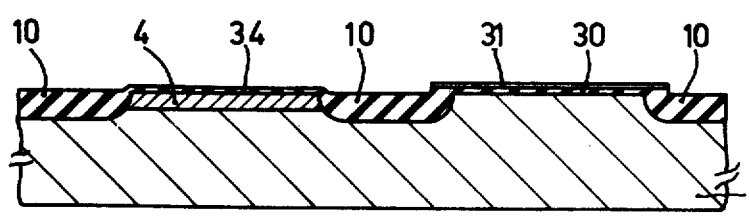
Figure 9:
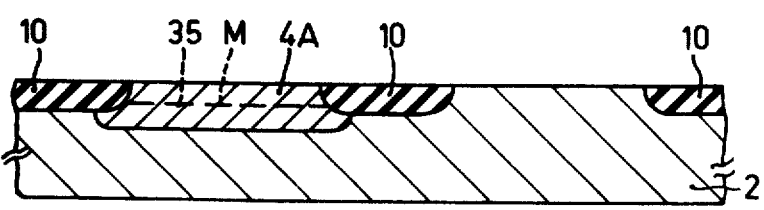
Figure 10:
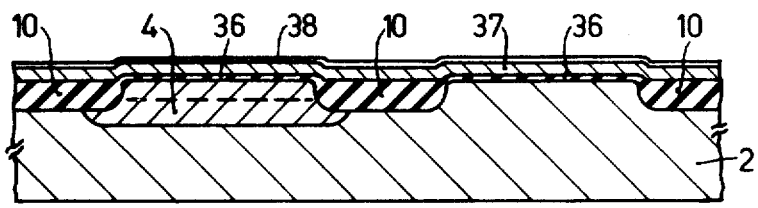

A boron diffusion with boron nitride as a source is then carried out, the structure shown in FIG. 8 being obtained, while using known methods and using a deposition at approximately 920° C and a drive-in. During said boron diffusion, in which the inset oxide pattern 10 serves as a mask, an oxide layer 34 below of which a p-type region 4 is present is formed on the silicon. In certain circumstances this region 4 may also be formed by other methods by doping from outside, for example by ion implantation, the oxide pattern 10 also serving as a mask. In so far as in this case a directed ion beam is used which does not cover the region of the field effect transistor B, and the ions have sufficient energy to penetrate through the layers 30 and 31, said layers need be removed only prior to the out-diffusion from the region 4 to be described hereinafter.

Without using a mask, the oxide layer 34 and, if desirable but not necessary, the nitride layer 31 are then removed successively by etching, after which the boron further penetrates partly into the silicon and for another part diffuses out via the surface at 1200° for 4 hours in a capsule in a vacuum.

Said out-diffusion is preferably carried out in the presence of silicon powder which either is not doped or has an accurately known comparatively low boron doping so as to obtain a desired threshold value for the surface concentration at the surface of the region 4.

In this out-diffusion also, the oxide pattern 10 serves as a mask as well as the oxide layer 30. At the surface is formed a region 4A, in which the boron concentration increases from a value of $10^{16}$ atoms/ccm at the surface to the interior to a maximum value of $3 \times 10^{17}$ atoms/ccm at a depth of 1.5 micron, at the area of the broken line 35 (M). The oxide layer 30 is then etched away without the use of a mask, see FIG. 9.

By a thermal oxidation, an oxide layer 36, 0.1 micron thick, is then provided (see FIG. 10), after which a 0.6 micron thick layer 37 of high-ohmic polycrystalline silicon is provided throughout the surface, for example, by thermal decomposition of $SiH_4$. Said layer 37 is then covered with a layer 38 of pyrolytically or thermally provided silicon oxide, thickness 0.1 micron.

Figure 11:
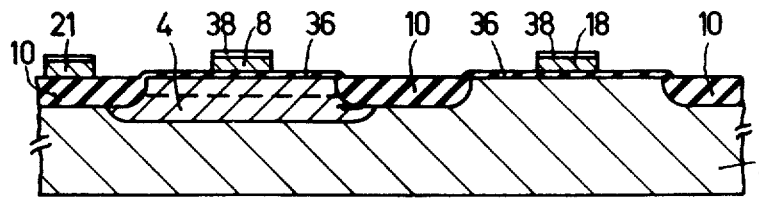

By means of known photolithographic etching methods, parts are then formed from the layers 37 and 38 which comprise the gate electrode layers 8 and 18 of the field effect transistors A and B to be provided, as well as the interconnection 21, see FIG. 11.

Figure 12:
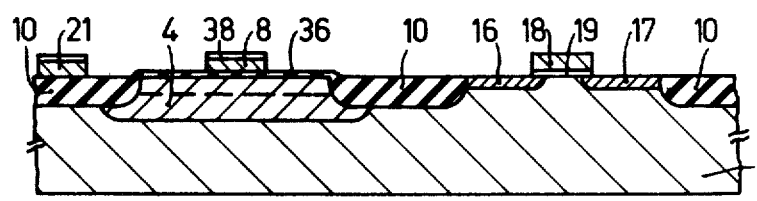
Figure 13:
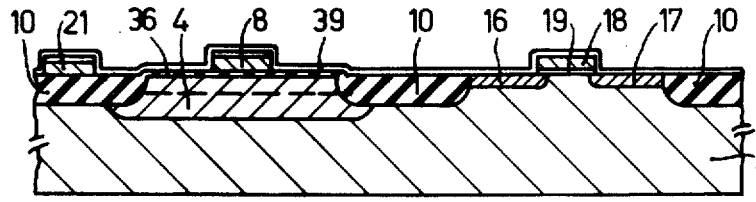
Figure 14:
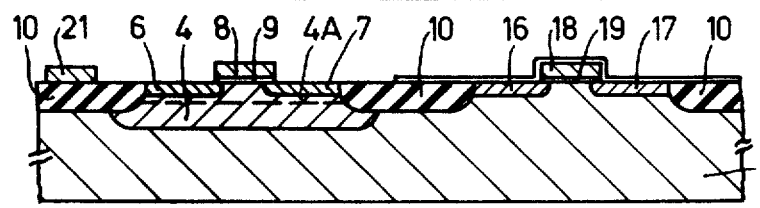

The oxide layer 36 on the surface part of the region 2 in which the p-channel field effect transistor B is to e provided, is then removed by etching with a buffer solution with HF, the part of the oxide layer 38 present on the gate electrode layer 18 being also etched away, see FIG. 12. The part 19 of the layer 36 present below the gate electrode layer 18 is maintained. The mask used in this etching step is not critical and may have a very great tolerance provided the part of the region 2 which is surrounded by the oxide pattern 10 and on which the gate electrode 18 is present is left free.

The p-type source and drain zones 16, 17 having a surface concentration of $10^{18}$ atoms/ccm are then provided in self-registration with the gate electrode 18, by a boron diffusion, the gate electrode layer 18 and the oxide pattern 10 serving as masks. This doping from outside may, if desirable, also be carried out differently by using the same masks, for example, by ion implantation. In this case and when using an ion beam of sufficient energy which does not cover the region of the field effect transistor A, the implantation may be carried out, if desirable, through the layers 36 and 38 which then need not be removed for this purpose.

During the provision of the zones 16 and 17, the gate electrode layer 18 is also doped with boron. This reduces the threshold voltage of the field effect transistor 16, 17, 18, 19.

A 0.1 micron thick layer 39 of silicon oxide is then provided (see FIG. 13) over the assembly, either thermally or by pyrolytic deposition. While using a likewise non-critical masking of the surface of the region 4, said layer 39 is then etched away, see FIG. 14, with the exception of the region 4B shown in FIG. 1. The part 9 of the layer 36 below the gate electrode layer 8 is maintained, while the surface parts of the region 4, with the exception of the region 4B and that present below the layer 8, as well as the layer 8, are entirely free from oxide. Phosphorus is then indiffused from outside to form the source and drain zones 6 and 7 with a surface concentration of $10^{20}$ atoms/ccm, in which the gate electrode layer 8 and the through connection 21 are also doped with phosphorus, which reduces the threshold voltage of the n-channel field effect transistor 6, 7, 8, 9 and the resistivity of the polycrystalline silicon. The gate electrode layer 8 and the oxide pattern 10 serve as masks during said doping. If desired, instead of by diffusion, said doping may also be carried out differently, for example by ion implantation, in which latter case the implantation may also be carried out via the layer 36, in which, when a directed ion beam is used which does not cover the region of the transistor B, the provision of the layer 39 may be omitted.

The zones 6 and 7 (see FIG. 14) are entirely present within the zones 4A of the region 4 in which the boron concentration of the surface increases to the interior. The comparatively high concentration at the area of the line 35 (FIG. 9) prevents channel formation between the region 2 and the zones 6 and 7 along the oxide 10.

A 0.6 micron thick layer 11 of silicon oxide is then provided over the assembly (see FIG. 2) in which layer contact windows are etched which may be present partly above the oxide pattern 10. Finally an aluminum layer is vapour deposited which is given the desired shape in the usual manner by a photolithographic etching method, in which the mask need be centered only with respect to the gate electrodes so that the structure of FIGS. 1 and 2 is obtained. The aluminum layer 12 contacts both the source zone 6 and the region 4B as a result of which the region 4 is short-circuited with the zone 6. The channel region 14 of the transistor B may be contacted on the lower side of the region. An annealing treatment is finally carried out for 30 minutes at 500° C in a mixture of $N_2$ and $H_2$.

In this manner a very compact structure is obtained (see FIG. 2) in which, for example, the following dimensions can be obtained:

$a = 10$ microns
$b = 6$ microns
$c = 10$ microns.

Many variations of the described method are possible. For example, in certain circumstances the gate electrode layers 8 and 18 may both be doped advantageously with boron (or both with phosphorus). For example, after providing the layer 37, said polycrystalline silicon layer is first doped with boron after which an oxide layer 38 of a rather large thickness (0.6 micron) is provided so as to protect the gate electrode layers 8 and 18 afterwards against the phosphorus diffusion, or conversely. Those skilled in the art will be capable of performing several other obvious variations of the method described which all have the same advantages in particular as regards compactness of the structure and non-critical alignment and masking steps. The doping of the polycrystalline silicon may in particular be carried out already in the stage of FIG. 10 during or immediately after providing the layer 37.

Should this be desirable, highly doped zones 40 (shown in broken lines) of the same conducticity type as the first region 2 may be provided in the structure described (see FIG. 2) so as to prevent an inversion channel to be formed between adjacent circuit elements, for example, between the region 4 and the zone 16. This may be carried out, for example, by locally doping the etched silicon surface of FIG. 5 with phosphorus before forming the oxide pattern 10. In the above-described example, however, this will generally be superfluous since during the growing of the oxide pattern 19 the donors in the n-type silicon region 2 tend to be forced into the region 2 upon oxidation of said silicon, as a result of which an accumulation of donor atoms will be formed at the boundary face with the oxide 10 in the region 2 and which is sufficiently large in general to prevent the formation of a p-type inversion channel.

The device according to the invention may furthermore comprise field effect transistors having more than one gate electrode, as well as other circuit elements, for example bipolar transistors. As an example, FIG. 15 is a diagrammatic cross-sectional view of a device having an n-channel tetrode field effect transistor C (n-type source and drain zones 6 and 7, gate electrode layers 58 and 59, n-type island 60), a p-channel field effect transistor D (p-type source and drain zones 16 and 17, gate electrode layers 61 and 62, p-type island 62) and a bipolar lateral p-n-p transistor E (p-type emitter and collector zones 64 and 65 with intermediate n-type base which forms part of the n-type region 2). Zones having the same reference numerals as in the preceding example, have the same function and the same conductivity type as stated there. The islands 60 and 63 may be provided simultaneously with and in the same manner as the source and drain zones 6, 7, 16 and 17 while using the masking effect of the gate electrode layers 58, 59, 61 and 62.

In such a structure, a bipolar transistor may advantageously also be provided differently. For example, FIG. 16 is a diagrammatic cross-sectional view of a combination of a pair of complementary field effect transistors F and G having a lateral bipolar transistor H. Parts having the same reference numerals again have the same meanings as in FIGS. 1 to 14. The lateral bipolar transistor H in this case is electrically insulated from the remaining part of the substrate 2 by the p-n junction 71. According to the invention, said structure can be manufactured in a very simple manner as follows. Starting material is, for example, as in the preceding examples, an n-type silicon wafer 2 in which, also in the same manner as described above, the inset oxide pattern 10 is formed and on which the gate oxide layer parts 9, 19, 80, 77 and 81 are formed, as well as the polycrystalline gate electrode layers 8, 18, 78, 76 and 79. While using analogous masking and diffusion steps as described above, the p-type regions 4 and 70, the p-type zones 16, 18, 72 and 73 and the n-type zones 6, 7, 74 and 75 are formed, preferably while using the masking properties of the oxide pattern 10 and the polycrystalline gate electrode layers 8, 18, 78, 76 and 79. The zones 4 and 70 may advantageously be provided in the same diffusion step, the zones 16, 17, 72 and 79 also in the same diffusion step and the zones 6, 7, 74 and 75 also in the same diffusion step. The gate electrode layers 8, 18, 78, 76 and 79 may be formed and doped simultaneously while the gate oxide layer parts 9, 19, 80, 77 and 81 may also be formed simultaneously. The p-type zone 70 constitutes the base zone and the n-type zones 74 and 75 constitute the emitter and collector zones of the lateral bipolar transistor. The auxiliary gate electrodes 76, 78 and 79 separated from the region 70 by the gate oxide layer parts 77, 80 and 81 are connected to the base zone 70 by metal layers 84, 85 via the contact diffusions 72, 73, so that any stray current channels formed below the electrodes 76, 78 and 79 are suppressed. Such stray current channels may for instance cause short circuits between emitter and collector and such auxiliary gate electrodes connected to the base constitute in themselves an important improvement of a (vertical or lateral) bipolar transistor. See also gate electrodes 95 and 106 (FIG. 17 and 18). The DC connection 86 between the polysilicon layer 76 and the metal layer 85, bypasses the cross-section shown and is therefore shown diagrammatically by a line. The auxiliary gate electrodes 76, 78 and 79 may be omitted in certain circumstances. It is obvious that the bipolar transistor H described with reference to FIG. 16, presents a particularly advantageous possibility of combining the field effect transistor structure F with bipolar elements, in particular bipolar transistors.

Another particularly advantageous combination of the field effect transistor structure F with a bipolar transistor (K) which can be realized in a very simple manner is shown in FIG. 17. In this case, K is a vertical transistor the collector zone of which is formed by the n-type substrate region 2, the base zone by the p-type region 90 and the emitter zone by the n-type region 93 which adjoins the inset oxide pattern 10. The collector contact is produced via the metal layer 97 and the highly doped n-type zone 94 bounded by the inset pattern. The base contact is produced via the metal layer 98 and the highly doped p-type zone 92. In order to avoid the formation of a stray current channel from the emitter to the collector, an auxiliary gate electrode 95 of polycrystalline silicon which is separated from the region 90 by an oxide layer 96 and is DC connected to the base zone via the metal layer 98 is used in this case also. This auxiliary gate electrode may be omitted when there is no danger of channel formation.

Starting material is again an n-type silicon substrate 2 in which the inset pattern 10 is formed and on which the gate oxide layer parts 9, 19, 96 and the polycrystalline gate electrode layers 8, 18 and 95 are provided. The p-type regions 4 and 90, the p-type zones 16, 17 and 92, and the n-type zones 6, 7, 93 and 94 are preferably provided while using masking by the oxide pattern 10 and the polycrystalline gate electrode layers 8, 18 and 95. In this case also the zones 4 and 90 may advantageously be provided simultaneously during the same diffusion step, as well as the zones 6, 7, 93 and 94 and the zones 16, 17 and 92. The gate electrode layers 8, 18 and 95 may also be provided and doped during the same manufacturing step, while the gate oxide layer parts 9, 19 and 96 are also provided in one oxidation and masking step.

It will be obvious that the invention is not restricted to the examples described, but that many variations are possible to those skilled in the art without departing from the scope of this invention. For example, other semiconductor materials than silicon, other insulating and masking layers and other metal layers may be used, while the gate electrode layers need not consist of polycrystalline silicon but may also be formed, for example, by a metal layer. The said conductivity types may be replaced by their opposite conductivity types. The sequence in which the various zones, insulating layers and gate electrodes are provided, may be varied in so far as the said conditions imposed upon the invention are fulfilled. The first region 2 may also be formed entirely or partly by an epitaxial layer provided on a substrate, the second region and the insulating pattern 10 extending throughout the thickness of said layer or over a part of said thickness.

This may be seen, for example, in FIG. 18 in which the n-type region 2 in the form of an epitaxial layer is provided in an n-type substrate 100. A p-type buried layer 101 is present between the layer 2 and the substrate 100. Adjoining this is a p-type region 102 which surrounds a region 103 of the n-type layer 2 entirely, said region 103 constituting the base zone of a p-n-p transistor of which the p-type surface zone 104 and the p-type region 101, 102 constitute the emitter and collector zones. The highly doped n-type zone 105 serves for contacting. An auxiliary gate electrode 106 (not always necessary), preferably of polycrystalline silicon, is connected to the base 103 of the transistor, serves as a separation between the diffusion zones 104 and 105, and prevents the formation of a stray inversion channel. The zones 4 and 102 are preferably provided simultaneously in one process step, as well as the zones 6, 7 and 105, the oxide layers 9 and 107 and the gate electrodes 8 and 106.

Besides by diffusion from the gaseous phase or by ion implantation, the doping of the various zones may finally also be carried out by a diffusion from, for example, a doped oxide layer.

What is claimed is:

1. A semiconductor device having a semiconductor body comprising at least one insulated gate field effect transistor, said body comprising a first region of a first type conductivity and a second region of a second type conductivity adjoining the surface and forming a p-n junction with the first region, said insulated gate field effect transistor having spaced source and drain zones of the first type conductivity in the second region and adjoining the surface, at least one gate electrode layer extending over the space between the source and drain zones and being separated from the semiconductor body by an insulating layer, a pattern of electrically insulating material at least partly inset in the semiconductor body and comprising a portion entirely surrounding the second region at the surface, the outer dimensions of said second region being defined solely by said inset pattern portion and by the p-n junction between the first and the second regions which adjoins said portion of the inset pattern, the source and drain zones also adjoining the inset pattern, said first region having a further part adjoining the surface outside said inset pattern portion, and a second circuit element comprising at least one surface zone of the second conductivity type in said further part of the first region and adjoining said inset pattern, said second region of the second type conductivity having a doping profile such that in a zone adjoining the surface the doping concentration increases to a maximum value from the surface to the interior.

2. A semiconductor device as claimed in claim 1, wherein said maximum concentration has such a high value as to prevent channel formation along the inset insulating pattern between the first region and the source or drain region present in the second region.

3. A semiconductor device as claimed in claim 2, wherein the source and drain regions present in the second region are situated entirely within the said zone adjoining the surface containing the said increasing doping concentration.

4. A semiconductor device as claimed in claim 1, wherein the depth of said maximum concentration is smaller than that of the inset insulating pattern surrounding the second region.

5. A CMOS semiconductor device having a semiconductor body comprising at least first and second complementary IGFETS, said body comprising a first region of a first type conductivity and a second region of a second type conductivity adjoining the surface and forming a p-n junction with the first region, said first IGFET having spaced source and drain zones of the first type conductivity in the second region and adjoining the surface and at least one gate electrode layer extending over the space between the source and drain zones and being separated from the semiconductor body by an insulating layer, and a pattern of electrically insulating material at least partly inset in the semiconductor body and comprising a first portion entirely surrounding the second region at the surface and a second portion entirely surrounding a further part of the first region outside the first inset pattern portion and adjoining the surface, the outer dimensions of said second region being defined wholly by said first pattern portion and by the p-n junction between the first and the second regions which adjoins said first portion of the inset pattern, the source and drain zones of the first IGFET also adjoining the inset pattern, said second IGFET having spaced source and drain surface zones of the second type conductivity in the said further part of the first region and also adjoining the inset pattern and at least one gate electrode layer extending over the space between the source and drain zones and being separated from the semiconductor body by an insulating layer, the inset pattern also comprising a portion which surrounds a third region of the second type conductivity which adjoins the surface and adjoins the said inset pattern, said third region forming a p-n junction with the first region, said third region having at least a further zone of the first type conductivity adjoining the surface which, together with the third region, forms part of a bipolar circuit element, the said further zone of the first type conductivity adjoining the inset pattern, the third region forming the base zone of a vertical bipolar transistor of which the said further zone and the first region forming the emitter and collector zones, and auxiliary gate electrodes provided above the third region and separated from the semiconductor surface by an insulating layer and DC connected to the base zone of the bipolar transistor so as to prevent the formation of stray current channels.

6. A semiconductor device having a semiconductor body comprising at least one insulated gate field effect transistor, said body comprising a first region of a first type conductivity and a second region of a second type conductivity adjoining the surface and forming a p-n junction with the first region, said insulated gate field effect transistor having spaced source and drain zones of the first type conductivity in the second region and adjoining the surface, at least one gate electrode layer extending over the space between the source and drain zones and being separated from the semiconductor body by an insulating layer, a pattern of electrically insulating material at least partly inset in the semiconductor body and comprising a portion entirely surrounding the second region at the surface, the outer dimensions of said second region being defined solely by said inset pattern portion and by the p-n junction between the first and the second regions which adjoins said portion of the inset pattern, the source and drain zones also adjoining the inset pattern, said first region having a further part adjoining the surface outside said inset pattern portion, a second circuit element comprising at least one surface zone of the second conductivity type in said further part of the first region and adjoining said inset pattern, said second region having a portion extending to and adjoining the surface through an aperture in one of said source and drain zones, said aperture being laterally bounded only by said one zone and the inset pattern, and a conductive layer on the surface and making contact with said one zone and with the second region portion in said aperture and constituting a common contact for both.

7. A CMOS semiconductor device having a semiconductor body comprising at least first and second complementary IGFETS, said body comprising a first region of a first type conductivity and a second region of a second type conductivity adjoining the surface and forming a p-n junction with the first region, said first IGFET having spaced source and drain zones of the first type conductivity in the second region and adjoining the surface and at least one gate electrode layer extending over the space between the source and drain zones and being separated from the semiconductor body by an insulating layer, and a pattern of electrically insulating material at least partly inset in the semiconductor body and comprising a first portion entirely surrounding the second region at the surface and a second portion entirely surrounding a further part of the first region outside the first inset pattern portion and adjoining the surface, the outer dimensions of said second region being defined wholly by said first pattern portion and by the p-n junction between the first and the second regions which adjoins said first portion of the inset pattern, the source and drain zones of the first IGFET also adjoining the inset pattern, said second IGFET having spaced source and drain surface zones of the second type conductivity in the said further part of the first region and also adjoining the inset pattern and at least one gate electrode layer extending over the space between the source and drain zones and being separated from the semiconductor body by an insulating layer, the gate electrode layers of both the first and second IGFETS being constituted by polycrystalline silicon material incorporating the same type dopants.

8. A semiconductor device as claimed in claim 7, wherein the polycrystalline silicon gate dopant is phosphorus.

9. A semiconductor device as claimed in claim 8, wherein the first region is N type, and the second region is P type.

* * * * *